(12) United States Patent
Kim et al.

(10) Patent No.: US 11,314,915 B2
(45) Date of Patent: Apr. 26, 2022

(54) METHODS OF DESIGNING LAYOUTS OF SEMICONDUCTOR DEVICES

(71) Applicant: Samsung Electronics Co., Ltd., Suwon-si (KR)

(72) Inventors: Jin Kim, Hwaseong-si (KR); Byungmoo Kim, Hwaseong-si (KR); Jaehwan Kim, Hwaseong-si (KR); Junsu Jeon, Suwon-si (KR)

(73) Assignee: Samsung Electronics Co., Ltd.

( * ) Notice: Subject to any disclaimer, the term of this patent is extended or adjusted under 35 U.S.C. 154(b) by 12 days.

(21) Appl. No.: 16/859,323

(22) Filed: Apr. 27, 2020

(65) Prior Publication Data
US 2021/0064807 A1    Mar. 4, 2021

(30) Foreign Application Priority Data
Sep. 3, 2019  (KR) .......................... 10-2019-0108757

(51) Int. Cl.
*G06F 30/30*   (2020.01)
*G06F 30/392*  (2020.01)
*G06F 30/398*  (2020.01)

(52) U.S. Cl.
CPC .......... *G06F 30/392* (2020.01); *G06F 30/398* (2020.01)

(58) Field of Classification Search
CPC ... G06F 30/392; G06F 30/398; H01L 27/0203
See application file for complete search history.

(56) References Cited

U.S. PATENT DOCUMENTS

| 5,745,374 | A  |   | 4/1998  | Matsumoto |
|-----------|----|---|---------|-----------|
| 6,049,659 | A  | * | 4/2000  | Matsumoto ............. G06F 30/30 716/119 |
| 8,799,847 | B1 | * | 8/2014  | Song ...................... G06F 30/39 716/122 |
| 8,826,213 | B1 | * | 9/2014  | Ho ........................ G06F 30/367 716/122 |
| 8,869,089 | B2 | * | 10/2014 | Baek ..................... G06F 30/398 716/122 |
| 9,009,641 | B2 |   | 4/2015  | Becker et al. |
| 9,496,179 | B2 |   | 11/2016 | Do et al. |
| 9,576,978 | B2 |   | 2/2017  | Baek et al. |
| 9,871,103 | B2 |   | 1/2018  | Kim et al. |
| 10,185,798| B2 |   | 1/2019  | Kim et al. |
| 10,236,302| B2 |   | 3/2019  | Correale, Jr. et al. |
| 10,339,249| B2 |   | 7/2019  | Lefferts |
| 2003/0145299 | A1 |   | 7/2003 | Fried et al. |
| 2005/0020015 | A1 | * | 1/2005 | Mathew ................ H01L 29/785 438/277 |

(Continued)

*Primary Examiner* — Jack Chiang
*Assistant Examiner* — Brandon Bowers
(74) *Attorney, Agent, or Firm* — Myers Bigel, P.A.

(57) ABSTRACT

A method of designing a layout of a semiconductor device includes determining from among a plurality of integrated circuit (IC) blocks in the semiconductor device a selection IC block for which a layout is to be changed, changing an spacing interval at which fin structures included in the selection IC block are spaced apart from each other in a first direction from a first spacing interval to a second spacing interval, and determining in the selection IC block locations of source/drain regions connected to the fin structures spaced apart from each other in the first direction at the second spacing interval.

20 Claims, 18 Drawing Sheets

(56) References Cited

U.S. PATENT DOCUMENTS

| | | | |
|---|---|---|---|
| 2009/0309162 A1* | 12/2009 | Baumgartner | H01L 29/7856 257/368 |
| 2014/0215420 A1 | 7/2014 | Lin et al. | |
| 2014/0325466 A1* | 10/2014 | Ke | H01L 21/845 716/119 |
| 2015/0121329 A1 | 4/2015 | Fu et al. | |
| 2016/0020326 A1* | 1/2016 | Mazure | H01L 21/308 257/347 |
| 2017/0194329 A1 | 7/2017 | Iwahori | |
| 2018/0122800 A1* | 5/2018 | Cheng | H01L 21/764 |
| 2018/0164052 A1* | 6/2018 | Nakamura | B21C 23/085 |

* cited by examiner

METHODS OF DESIGNING LAYOUTS OF SEMICONDUCTOR DEVICES

CROSS-REFERENCE TO RELATED APPLICATION(S)

This application claims the benefit of priority under 35 U.S.C. § 119 (a) to Korean Patent Application No. 10-2019-0108757, filed on Sep. 3, 2019, in the Korean Intellectual Property Office, the entire disclosure of which is incorporated by reference here in for all purposes.

TECHNICAL FIELD

The present disclosure relates to methods of designing layouts of semiconductor devices.

BACKGROUND

As the degree of integration of semiconductor devices increases, development of corresponding process technologies is also actively progressing. Some methods of manufacturing semiconductor devices may include a plurality of design tasks performed sequentially. When a new process is developed, changes to semiconductor device designs may be needed, in order to apply the new process to semiconductor devices that have already been designed. Design changes may take a relatively long time, which not only reduces productivity, but may also cause significant disruptions to business.

SUMMARY

Some aspects of the present inventive concepts provide methods of designing layouts of semiconductor devices, in which time and resources that are required for design changes may be significantly reduced. Accordingly, a newly developed process may be quickly applied by changing the layout of an already designed semiconductor device to a new layout as needed.

According to some aspects of the present inventive concepts, a method of designing a layout of a semiconductor device includes determining from among a plurality of integrated circuit (IC) blocks included in the semiconductor device a selection IC block for which a layout is to be changed, changing a spacing interval at which fin structures included in the selection IC block are spaced apart from each other in a first direction from a first spacing interval to a second spacing interval, determining locations in the selection IC block of source/drain regions connected to the fin structures spaced apart from each other in the first direction by the second spacing interval.

According to some aspects of the present inventive concepts, a method of designing a layout of a semiconductor device includes determining in the semiconductor device a selection area in which an original layout is to be changed to a new layout and a non-selection area in which the original layout is to be maintained, changing the original layout of the selection area to the new layout such that a second spacing interval between fin structures in the selection area is less than a first spacing interval between fin structures in the non-selection area, where in the fin structures are spaced apart from each other in a first direction parallel to an upper surface of a substrate, generating an entire layout for the semiconductor device by merging the selection area and the non-selection area, and verifying the entire layout.

According to some aspects of the present inventive concepts, a method of designing a layout of a semiconductor device includes replacing original fin structures spaced apart from each other in a first direction at a first spacing interval in a first direction with new fin structures spaced apart from each other in the first direction at a second spacing interval less than the first spacing interval, arranging new source/drain regions with respect to a boundary of the new fin structures that is parallel to a second direction that intersects the first direction, arranging a cut area that divides the new fin structures with respect to a boundary of the new source/drain regions that is parallel to the second direction, and arranging new active contacts connected to the new source/drain regions with respect to the boundary of the new fin structures parallel to the second direction.

According to an aspect of the present inventive concept, a semiconductor device includes a first integrated circuit (IC) block having first fin structures arranged at a first interval in a first direction parallel to an upper surface of a substrate, and a second IC block having second fin structures arranged at a second interval less than the first interval in the first direction. The number of dummy fin structures included in the second IC block is greater than the number of dummy fin structures included in the first IC block.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, some example embodiments will be described with reference to the accompanying drawings.

Figure 1:
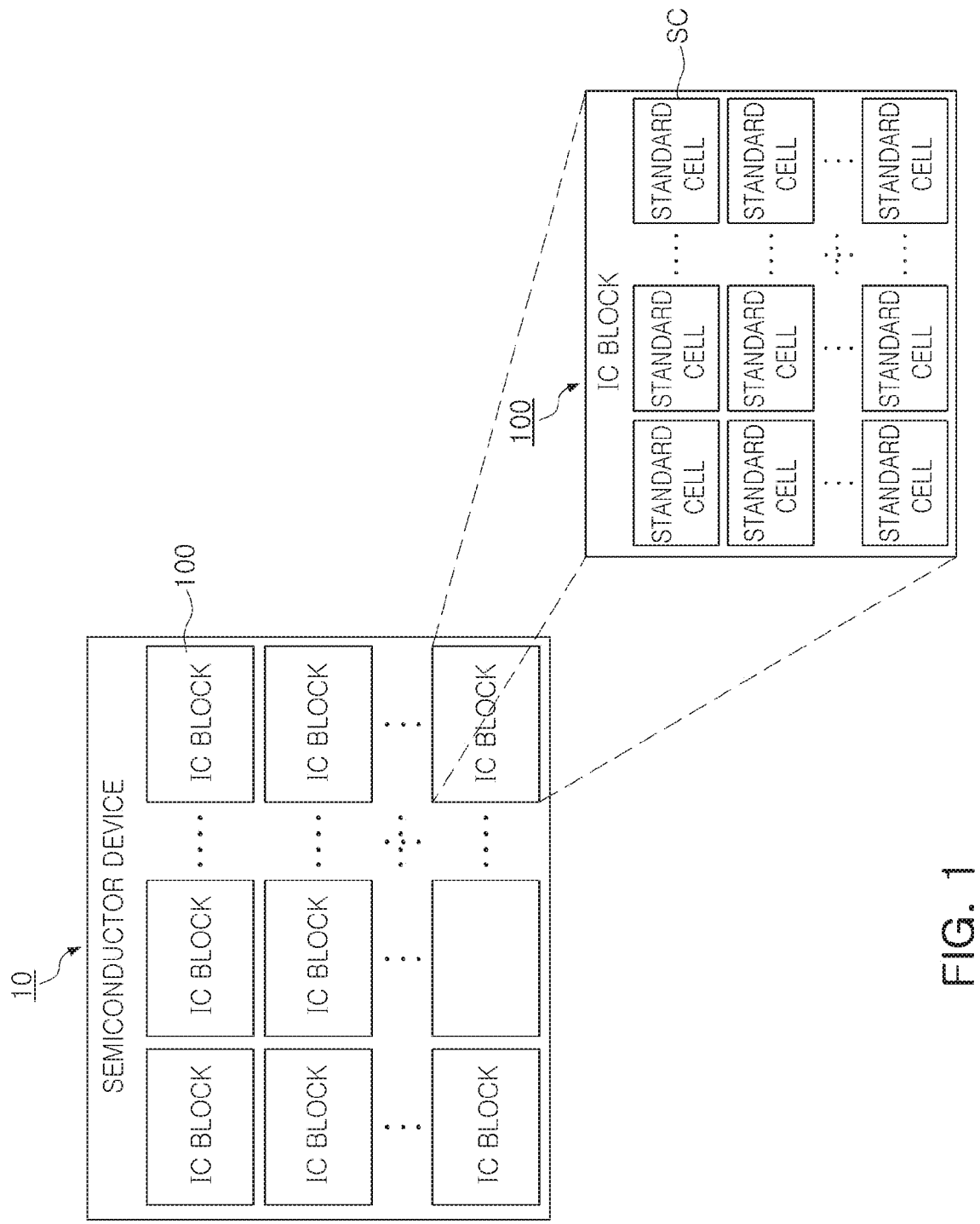
FIGS. 1 to 3 are schematic views illustrating a semiconductor device according to some example embodiments.
Figure 2:
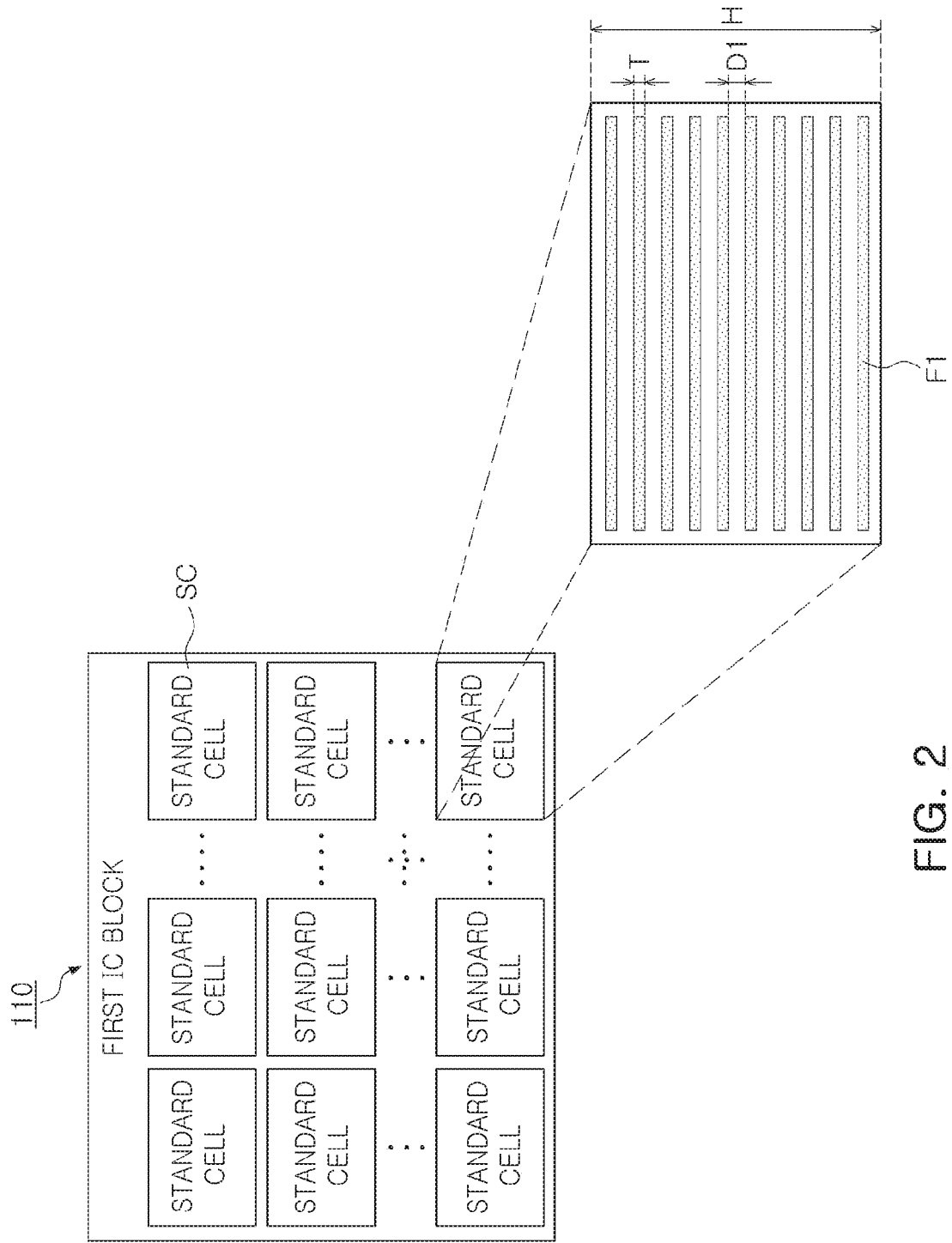
Figure 3:
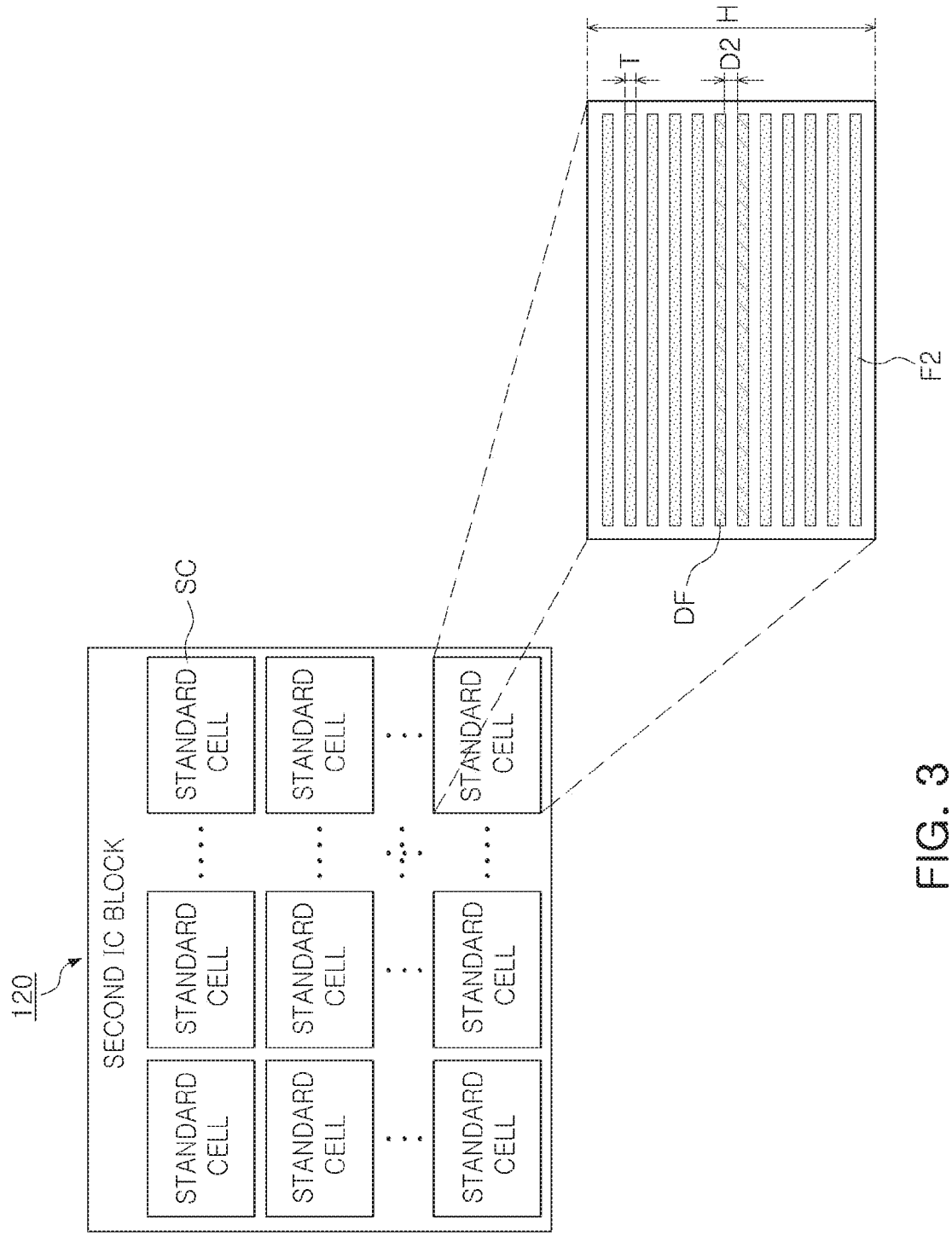

FIGS. 1 to 3 are schematic views illustrating a semiconductor device according to an example embodiment.

First, referring to FIG. 1, a semiconductor device 10 according to some example embodiments may include a plurality of integrated circuit (IC) blocks 100. The IC blocks 100 may be connected to each other by a wiring formed of a conductive material. According to some example embodiments, the IC blocks 100 may provide a power supply voltage generation circuit, a clock generation circuit, an interface circuit, a page buffer circuit, a sampling circuit, or the like. The type and number of circuits provided by the IC blocks 100 may vary depending on the semiconductor device 10.

Each of the IC blocks 100 may include a plurality of standard cells SC. The function provided by the respective IC blocks 100 may be determined by selecting, placing and routing at least a portion of the standard cells SC stored in a library. Therefore, the types and arrangements of the standard cells SC included in at least a portion of the IC blocks 100 included in a single semiconductor device 10 may be different.

The standard cell SC is the unit of a layout to implement the respective IC blocks 100 and may have a structure based on a predetermined standard. For example, the standard cell SC may include at least one or more gate electrodes extending in a first direction, which may be separated from each other in a second direction that is perpendicular the first direction. The standard cell SC may include at least one or more fin structures extending in the second direction, which may be separated from each other in the first direction. A source/drain region may be arranged on the fin structure, and the location of a contact connected to the gate electrode and the source/drain region may be defined in the standard cell SC. According to some example embodiments, the locations of a via and a metal wire connected to the contact may also be defined in the standard cell SC.

In general, methods of designing a layout of the semiconductor device 10 may include a task of designing a layout by arranging standard cells SC and IC blocks 100, a task of verifying the designed layout, as well as other tasks. In designing a layout, a design rule manual (DRM) and a design kit that provide design rules for layout design may be used. The DRM and the design kit may be determined by a manufacturing process for producing the semiconductor device 10. Therefore, when a newly developed process is to be applied to the semiconductor device 10, procedures may be performed in which the DRM and the design kit are updated. After changing the layout of the standard cell SC using the updated design kit, the layout of the IC blocks 100 are changed using the changed standard cell SC, and other tasks may be performed. This procedure may consume a significant amount of time and may be very disadvantageous in terms of productivity, efficiency and commercial aspects.

In some example embodiment of the present inventive concept, a method may be performed in which an original layout of a selection area is changed to a new layout appropriate to a new process in the semiconductor device 10 that has already been designed, without updating the design rule manual and the design kit and changing the layout of the standard cell SC. Therefore, when a new process that may improve performance, reduce power consumption, and/or provide other advantages is developed, the time required to actually apply the new process to the semiconductor device 10 may be significantly reduced, thereby significantly saving time, costs and resources in terms of business, and improving productivity and/or efficiency.

In addition, in some example embodiments, at least portions of the IC blocks 100 included in the semiconductor device 10 may be selected to determine a selection area, and the original layout may be changed to a new layout, limited to the selection area. For example, in at least a portion of the IC blocks 100 included in one semiconductor device 10, intervals between the fin structures and the numbers of dummy fin structures may be different, which will be described with reference to FIGS. 2 and 3 below.

FIG. 2 is a diagram schematically illustrating a first IC block 110 among the IC blocks 100 included in the semiconductor device 10. Referring to FIG. 2, the first IC block 110 may include a plurality of standard cells SC, and intervals between the fin structures in the standard cells SC included in the first IC block 110 may be the same.

For example, the standard cell SC included in the first IC block 110 may include first fin structures F1. The first fin structures F1 may be separated from each other by a first interval D1 in a first direction (a longitudinal direction) and may have a predetermined width T. A height H of the standard cell SC in the first direction may be determined depending on the width T and the number of the first fin structures F1 included in the standard cell SC, as well as the first interval D1 between the first fin structures F1.

FIG. 3 is a diagram schematically illustrating a second IC block 120 among the IC blocks 100 included in the semiconductor device 10. Referring to FIG. 3, the second IC block 120 may include a plurality of standard cells SC. Similar to the description with reference to FIG. 2, intervals between the fin structures in the standard cells SC included in the second IC block 120 may be the same.

As an example, the standard cell SC included in the second IC block 120 may include second fin structures F2. The second fin structures F2 may be separated from each other by a second interval D2 in the first direction (longitudinal direction), and may have a predetermined width T. A height H of the standard cell SC in the first direction may be determined depending on the width T and the number of the second fin structures F2 included in the standard cell SC and the second interval D2 between the second fin structures F2.

Comparing the standard cells SC of FIGS. 2 and 3 to each other, the width T of the first fin structures F1 and the width T of the second fin structures F2 may be equal to each other, while the first interval D1 may be greater than the second interval D2. However, according to some example embodiments, the width T of the first fin structures F1 and the width T of the second fin structures F2 may also be different from each other. In addition, according to some embodiments, in the standard cell SC of the second IC block 120, a t least portions of the second fin structures F2 may be dummy fin structures DF. For example, as the fin structures are changed from the first fin structures F1 to the second fin structures F2 by changing the layout of the second IC block 120, the dummy fin structures DF may be inserted in the free space. Accordingly, the second IC block 120 may include fin structures spaced at smaller intervals than the first IC block 110, and may thus include relatively more dummy fin structures.

Accordingly, when the first IC block 110 and the second IC block 120 have the same area, the second IC block 120 may include more fin structures than the first IC block 110. Since the first IC block 110 and the second IC block 120 are different from each other in the width of the fin structures and/or in the interval between the fin structures, the first IC block 110 and the second IC block 120 may have layouts based on different design rules. However, in some example embodiments, the gate electrodes included in each of the first IC block 110 and the second IC block 120 may be arranged to have the same interval. For example, the first IC block 110 and the second IC block 120 may have different arrangements of the fin structures, and different arrangements of the active region, of the cut area, and of the contact, while the arrangement type of the gate electrodes may be the same.

Figure 4:
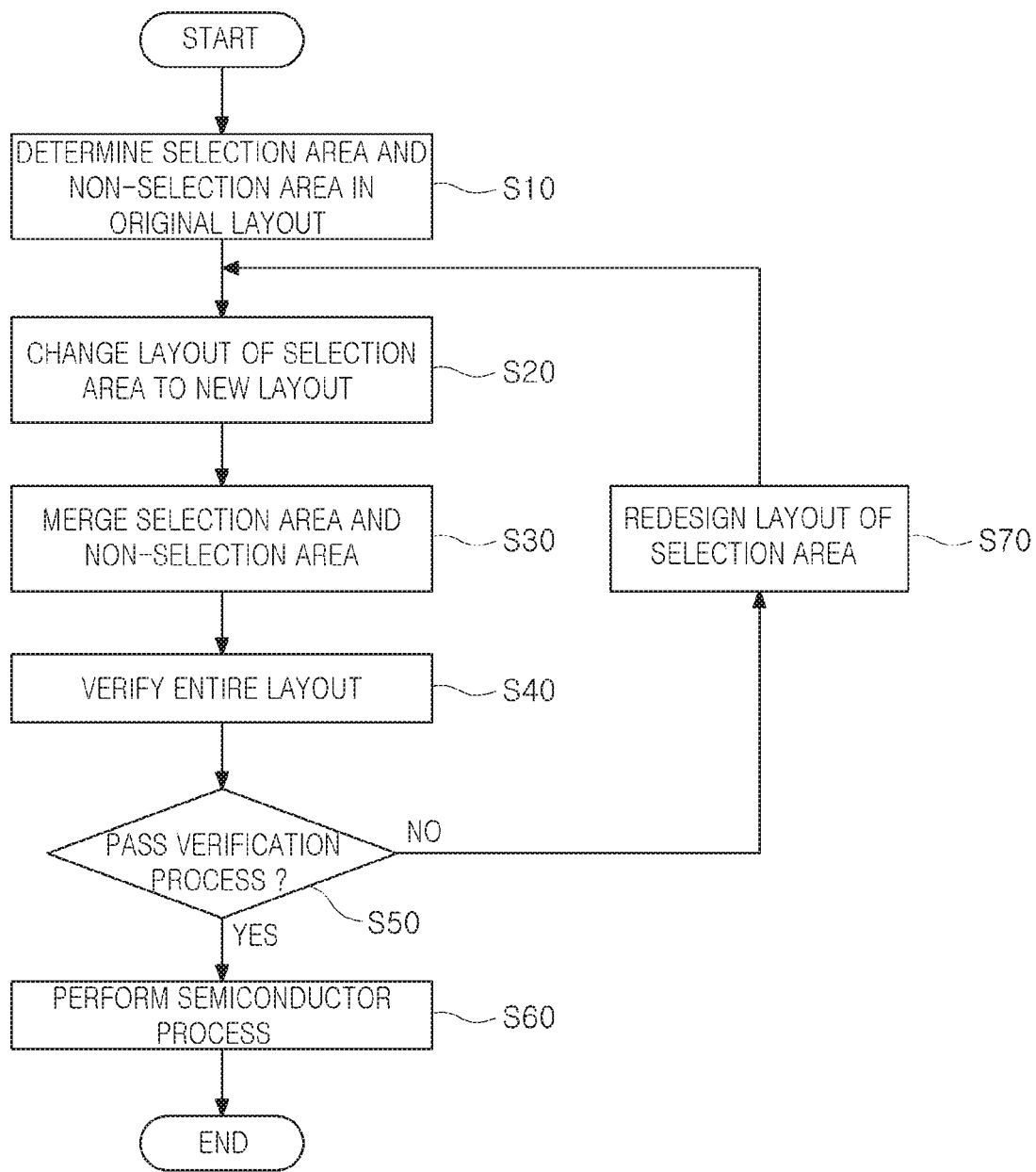
FIGS. 4 and 5 are flowcharts illustrating a method of designing a layout of a semiconductor device according to some example embodiments.
Figure 5:
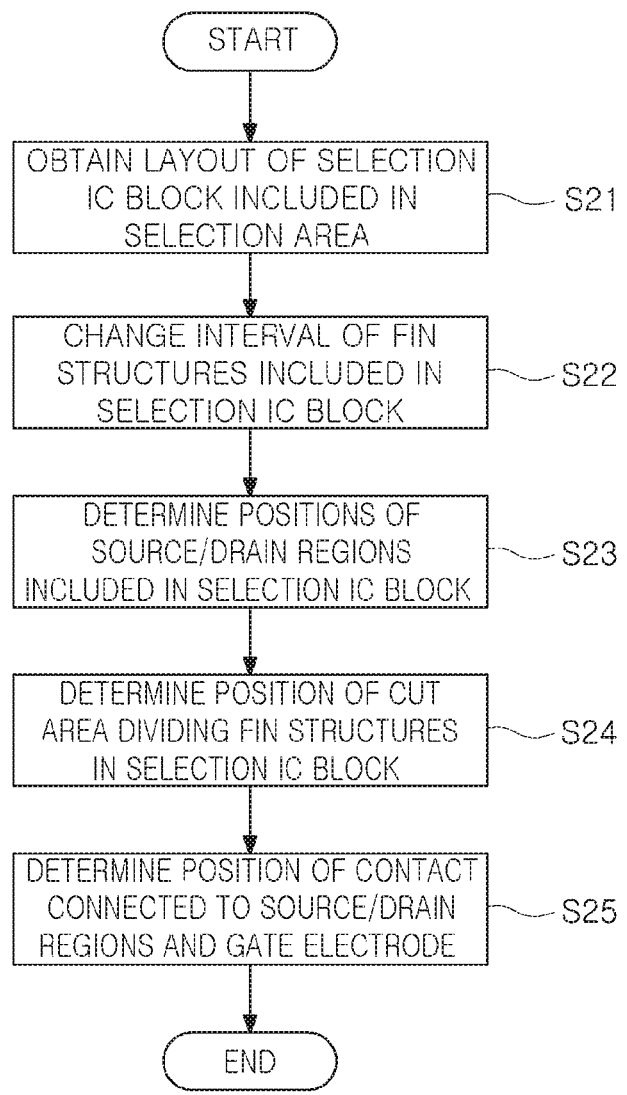

FIGS. 4 and 5 are flowcharts illustrating a method of designing a layout of a semiconductor device according to some example embodiments.

First, referring to FIG. 4, a method of designing a layout of a semiconductor device according to some example embodiments may start by determining a selection area and a non-selection area in an original layout (S10). The original layout may be a layout designed according to a design rule manual in which a design rule that may be implemented in an existing process is reflected, and by a design kit provided according to the existing process.

The selection area determined in S10 may be an area in which the original layout is to be changed to a new layout. The new layout may be a layout designed according to a design rule that may be implemented in a new process that is different from the existing process. For example, when the layout of the selection area is changed from the original layout to the new layout, a change may occur in performance and/or power consumption, but the functions performed in the selection area may be the same. The non-selected area is an area other than the selection area, and may be an area in which the original layout is maintained as it is.

When the selection area and the non-selection area are determined, the layout of the selection area may be changed to a new layout (S20). In operation S20, the layout of the selection area may be changed from the original layout to the new layout. An example method of changing an original layout to a new layout will be described in more detail with reference to FIG. 5. Hereinafter, for convenience of description, a detailed example case is provided in which the new process, which is the basis of the layout change, is a process capable of forming fin structures at smaller intervals than fin structures in the existing process. The present disclosure is not limited to this detailed example.

Referring to FIG. 5, the method of changing a layout of a selection area from an original layout to a new layout may beg in by obtaining a layout of a selection IC block included in the selection area (S21). The selection area may include at least one selection IC block, and the method according to an example embodiment of the present inventive concept may bring a layout of at least one selection IC block included in the selection area.

Next, the interval of the fin structures included in the selection IC block may be changed with reference to the layout of the selection IC block (S22). For example, in the method according to some example embodiments, the selection IC block may be divided in to standard cells, and the interval between the fin structures included in each of the standard cells may be reduced to a relatively narrower interval according to a new process. According to example embodiments, the respective widths of the fin structures may be maintained constantly or changed together.

When the interval between the fin structures is changed, the locations of source/drain regions included in the selection IC block may be determined accordingly (S23). For example, in operation S22, the locations of the fin structures may be changed to reduce an interval between the fin structures while maintaining the boundary between standard cells. Therefore, if the source/drain regions based on the original layout are maintained without any changes, problems may occur in the operation of the selection IC block. In operation S23, the locations of the source/drain regions may be adjusted in consideration of the locations of the fin structures changed in operation S22. In this case, according to some example embodiments, the number of fin structures connected to at least one of the source/drain regions in the new layout may be different from the number in the original layout.

Next, the location of a cut area dividing the fin structures may be determined (S24). The location of the cut area may be determined by referring to the source/drain regions determined in operation S23. In some example embodiments, the location of the cut area may be determined with reference to a design rule that defines an interval between the boundary of the cut area and the boundaries of the source/drain regions.

Next, the location of a contact connected to the source/drain regions and a gate electrode may be determined (S25). The location of the contact connected to the source/drain regions may be changed in coordination with the change of the location of the source/drain regions determined in operation S23. In determining the location of the contact connected to the source/drain regions, a design rule that defines the interval between the boundary of the contact and the boundary of the fin structures connected to the source/drain regions may be considered. In addition, the interval between the contacts connected to the source/drain regions adjacent to each other may be considered together.

Returning now to FIG. 4, when the layout of the selection area is changed to the new layout by the method according to the example embodiment illustrated in FIG. 5, the selection area and the non-selection area may be merged in the method according to the example embodiment of the present disclosure (S30). Therefore, in a layout representing one semiconductor device, a new layout according to the design rule for applying a new process and an original layout according to the design rule for applying the existing process may be mixed.

When the entire layout of the semiconductor device is completed, verification of the entire layout may be executed (S40). The verification of operation S40 may include operations such as a design rule check (DRC), a layer Versus Layer (LVL), and a connectivity check. When the verification of operation S40 is completed, it can be determined whether the entire layout has passed the verification (S50).

When it is determined in operation S50 that the entire layout has passed the verification ("Yes" branch from operation S50), a mask for the manufacture of the semiconductor device may be generated by performing optical proximity correction, mask tape-out (MTO), mask data preparation (MDP), or the like, on the layout, and the semiconductor device may be produced by performing a semiconductor process (S60).

When it is determined in operation S50 that the entire layout has not passed the verification ("No branch from operation S50), the new layout of the selection area may be redesigned (S70), and the layout of the selection area may be changed to the redesigned new layout. Operation S70 may include a monitoring procedure for a new process to be applied to the selection area.

Figure 6:
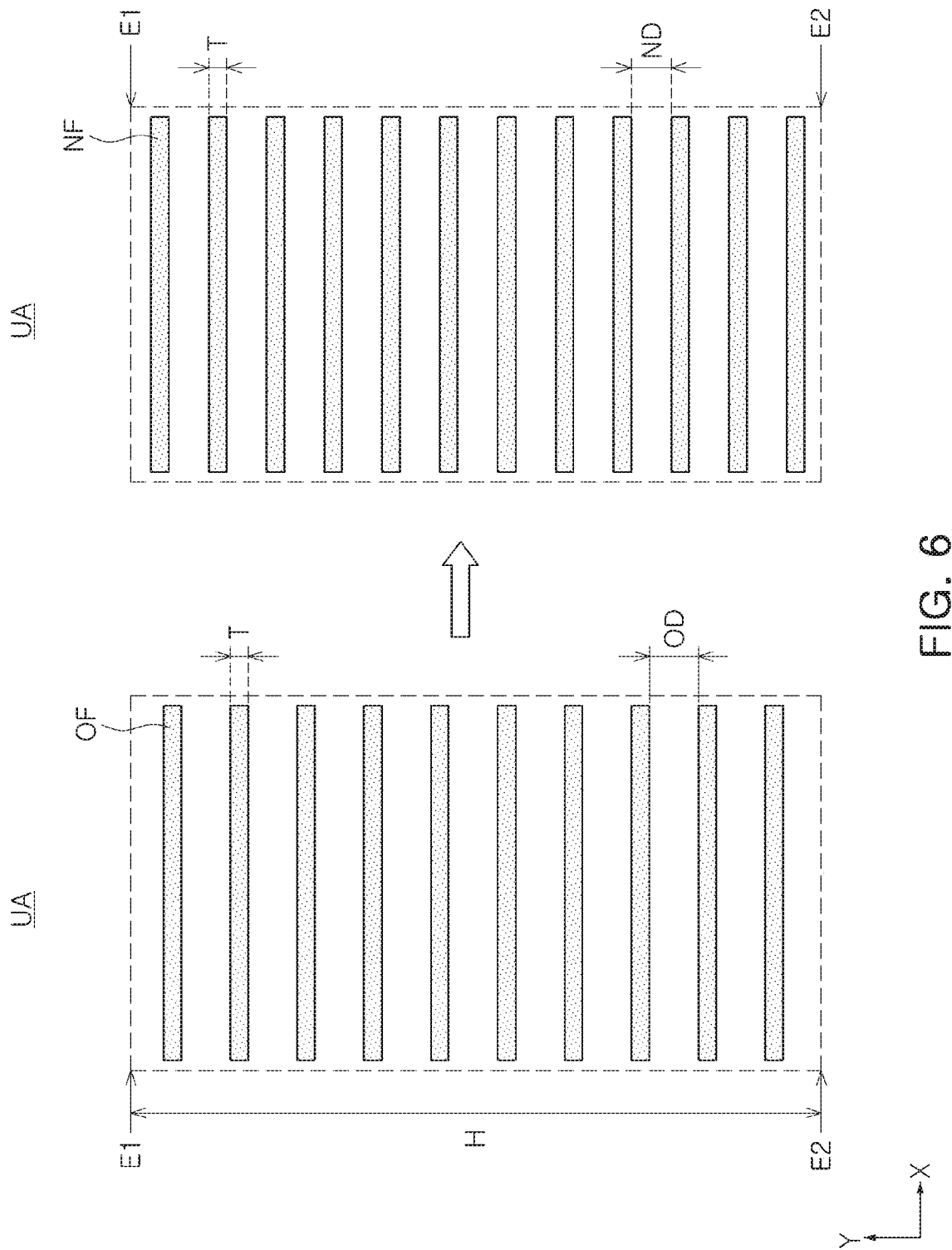
FIGS. 6 and 7 are views illustrating a method of designing a layout of a semiconductor device according to some example embodiments.
Figure 7:
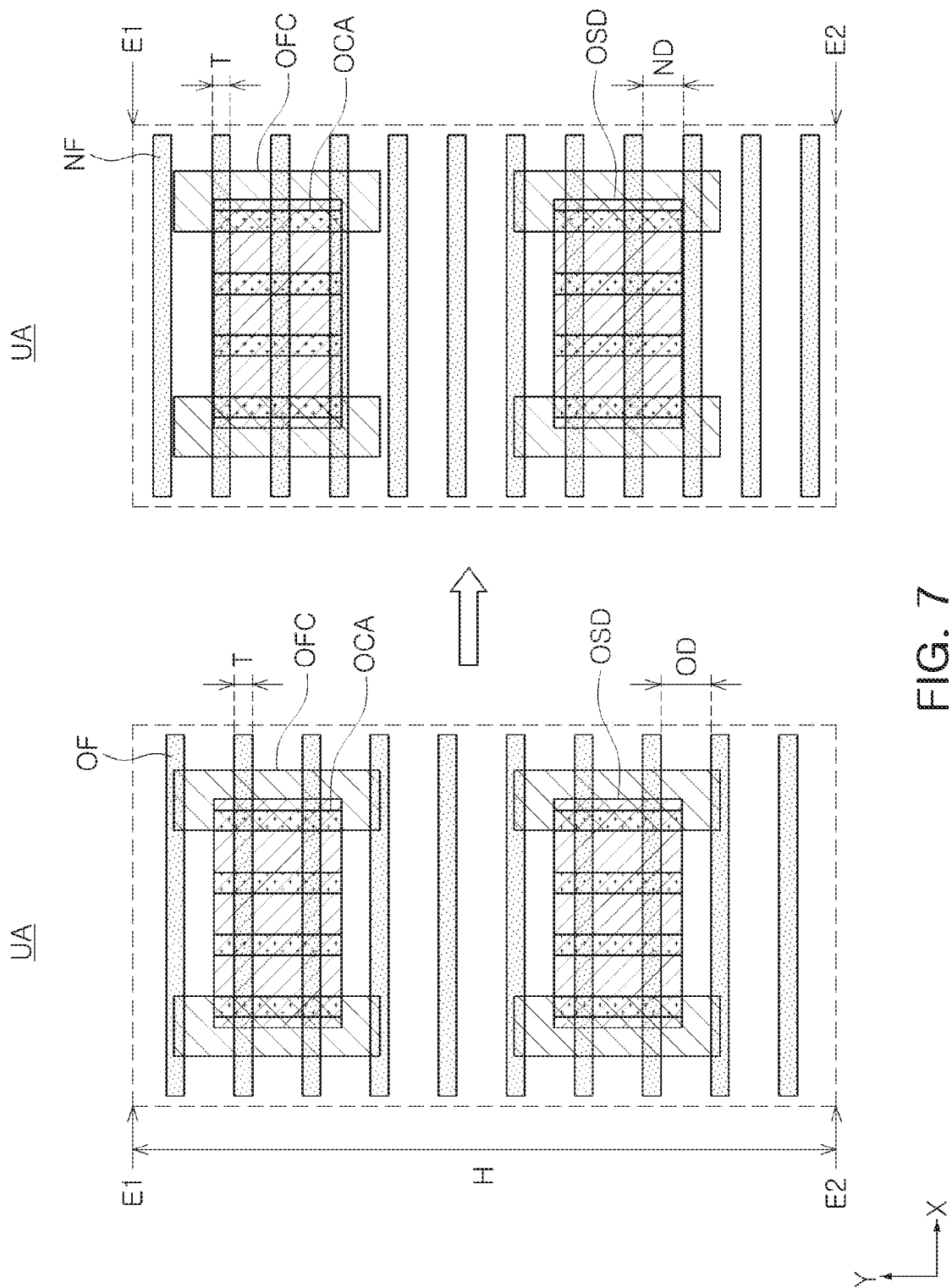

FIGS. 6 and 7 are views illustrating aspects of methods of designing a layout of a semiconductor device according to some example embodiments.

FIG. 6 is a diagram illustrating a unit area UA included in the selection area in which an original layout is to be changed to a new layout in a semiconductor device. The original layout and the new layout may be layouts by design rules determined by different processes.

The unit area UA may be determined by various methods, and in some example embodiments, the unit area UA may correspond to a standard cell. When the unit area UA corresponds to a standard cell, a first boundary E1 and a second boundary E2 of the unit area UA may correspond to center lines of power lines supplying different power voltages. A height H of the unit area UA may be equal to a height of the standard cell. However, according to some example embodiments, the first boundary E1 and the second boundary E2 of the unit area UA may be defined according to other methods. The unit area UA illustrated on the left side of FIG. 6 may include original fin structures OF designed by the original layout, and a unit area UA illustrated on the right side of FIG. 6 may include new fin structures NF designed by the new layout.

Referring to FIG. 6, a width T of the original fin structures OF and a width T of the new fin structures NF may be the same. However, according to some example embodiments, the original fin structures OF and the new fin structures NF may have different widths. An interval OD between the original fin structures OF may be different from an interval ND between the new fin structures NF. In some example embodiments, the interval OD between the original fin structures OF may be less than the interval ND between the new fin structures NF.

FIG. 7 is a drawing illustrating a case in which original fin structures OF are changed to new fin structures NF, and original source/drain regions OSD, an original contact OCA, and original cut areas OFC are maintained intact. Referring to FIG. 7, problems may occur in design and/or process as the original source/drain regions OSD, the original contact OCA, and the original cut areas OFC remain intact.

For example, referring to the layout illustrated on the right side of FIG. 7, in a portion of the original contact OCA, an interval between a boundary of the original contact OCA and a boundary of the new fin structures NF may not be sufficiently secured. In an example, an interval between the contact and the fin structures may need to be at least a minimum distance, which may be defined in a design rule. Therefore, as illustrated in FIG. 7, the case in which only the original fin structures OF are changed to the new fin structures NF, and the remaining components, for example, the original source/drain regions OSD, the original contact OCA, and the original cut areas OFC are maintained as they are, may be problematic in a design and/or process.

In some example embodiments of the present inventive concepts, new fin structures NF may be generated by adjusting the interval and/or width of the original fin structures OF, and the location and/or size of the source/drain regions, and thus, the contacts and the cut areas may be changed, based on the new fin structures NF, thereby significantly reducing design and/or process issues associated with changing the original layout of the selection area to a new layout.

Figure 8:
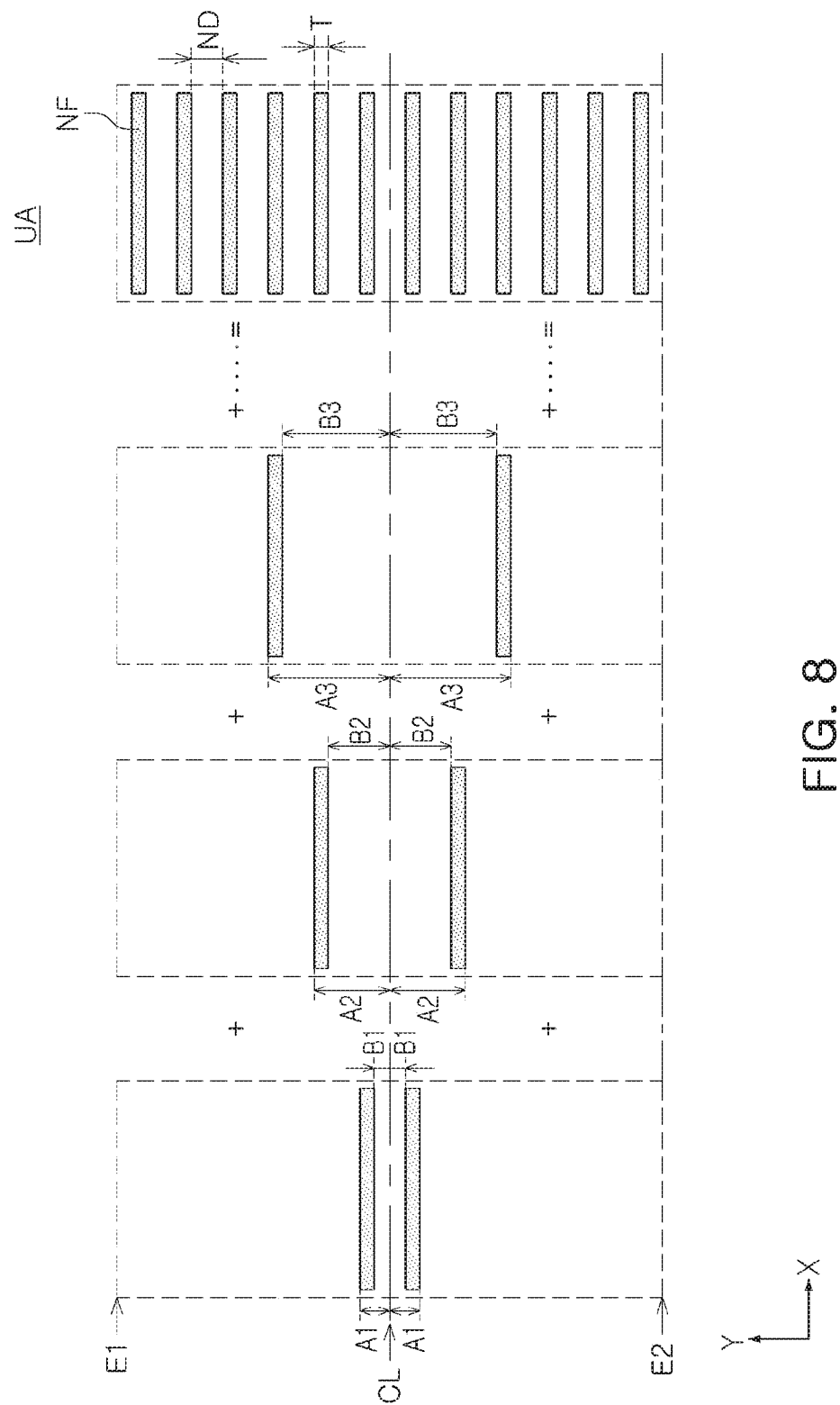
FIGS. 8 to 10 are views illustrating a method of designing fin structures, in a method of designing a layout of a semiconductor device according to some example embodiments.
Figure 9:
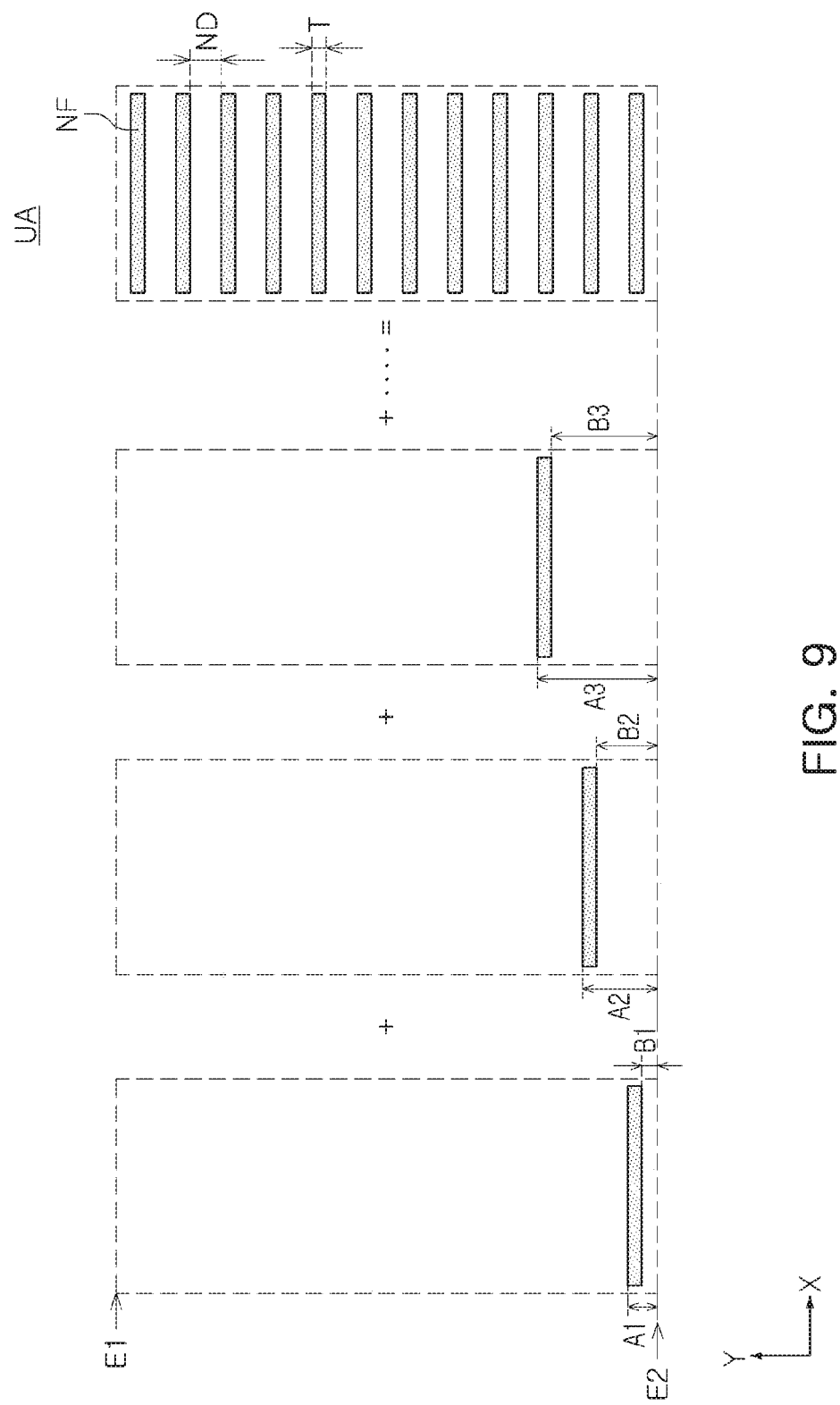
Figure 10:
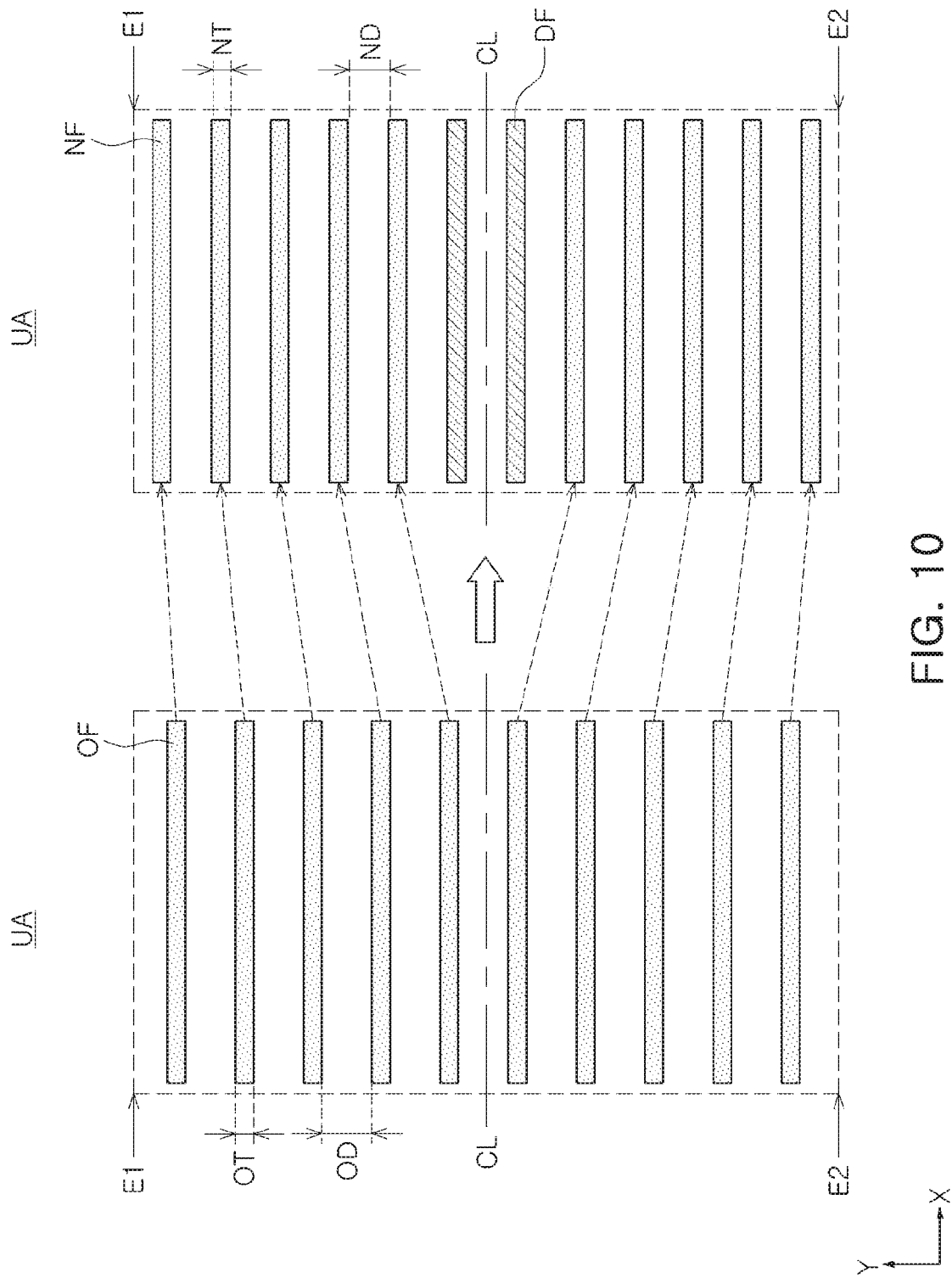

FIGS. 8 to 10 are views illustrating a fin structure designing method, in a method of designing a layout of a semiconductor device according to some example embodiments.

First, referring to FIG. 8, in an example embodiment illustrated in FIG. 8, a unit area UA may be set, and locations of new fin structures NF may be designated based on a center line CL of the unit area UA. For example, the center line CL may be a center line of a standard cell. In this case, a first boundary E1 and a second boundary E2 of the unit area UA may correspond to center lines of power lines arranged at upper and lower boundaries of the standard cell. In some example embodiments, the center line CL may be a center line of one of the power lines, and in this case, the first boundary E1 and the second boundary E2 may be center lines of the standard cell.

Referring to FIG. 8, first fin boundaries A1 and B1 may be defined at upper and lower portions from the center line CL in a first direction (Y-axis direction). The first fin boundaries (A1 and B1) may include a first outer fin boundary A1 and a first inner fin boundary B1. A new fin structure NF extending in a second direction (X-axis direction) intersecting the first direction may be formed between the first fin boundaries A1 and B1. In this case, the interval between the first inner fin boundaries B1 adjacent to each other in the first direction with respect to the center line CL may be equal to the interval ND between the new fin structures NF. A difference between the first outer fin boundary A1 and the first inner fin boundary B1 in each of the upper and lower portions of the center line CL may correspond to the width T of each of the new fin structures NF.

Next, second fin boundaries A2 and B2 may be defined at upper and lower portions of the center line CL in the first direction. The second fin boundaries (A2 and B2) may include a second outer fin boundary A2 and a second inner fin boundary B2. The new fin structure NF may be formed between the second fin boundaries A2 and B2, to extend in the second direction.

In the example embodiment illustrated in FIG. 8, locations of the new fin structures NF may be designated at the upper and lower portions with respect to the center line CL in the first direction. For example, when N new fin structures NF need to be arranged in one unit area UA, N/2 operations may be repeated to designate respective locations of the new fin structures NF. The value of the n-th fin boundaries (where n is a natural number equal to or less than N/2) for designating each location of the new fin structures NF may be expressed as in Equation 1 below. In Equation 1, T is a width of the new fin structures NF and ND is an interval between the new fin structures NF.

$$An = CL \text{ location} \pm \{(T+ND/2)+(n-1)\times(T+ND)\}$$

$$Bn = CL \text{ location} \pm \{ND/2+(n-1)\times(T+ND)\} \quad \text{[Equation 1]}$$

Next, referring to FIG. 9, in some example embodiments, the locations of the new fin structures NF with respect to one of the first boundary E1 and the second boundary E2 of the unit area UA may be designated. For example, the unit area UA may correspond to a standard cell, and in this case, the first boundary E1 and the second boundary E2 may correspond to center lines of power lines extending in the second direction. For convenience of description, a method of defining locations of the new fin structures NF based on the second boundary E2 will be described below.

Referring to FIG. 9, first fin boundaries A1 and B1 may be defined in the first direction from the second boundary E2. The first fin boundaries (A1 and B1) may include a first outer fin boundary A1 and a first inner fin boundary B1, and a new fin structure NF may be formed between the first outer fin boundary A1 and the first inner fin boundary B1. In a manner similar thereto, second fin boundaries A2 and B2 are defined from the second boundary E2, and a new fin structure NF may be formed between the second fin boundaries A2 and B2. When N new fin structures NF need to be arranged in one unit area UA, N operations may be repeated to designate respective locations of the new fin structures NF. For example, values of n-th fin boundaries (where n is a natural number less than or equal to N) for designating the location of each of the new fin structures NF may be expressed by Equation 2 below. In Equation 2, T is a width of the new fin structures NF and ND is a interval between the new fin structures NF $$An = E2 \text{ location} + \{(T+ND/2)+(n-1)\times(T+ND)\}$$

$$Bn = E2 \text{ location} + \{ND/2+(n-1)\times(T+ND)\} \quad \text{[Equation 2]}$$

Referring next to FIG. 10, in some example embodiments, original fin boundaries defining the locations of original fin structures OF may be converted to new fin boundaries defining the locations of new fin structures NF, respectively. For example, a center line CL may be defined between a first boundary E1 and a second boundary E2 of the unit area UA. Referring to the original fin structures OF and the new fin structures NF located between the center line CL and the first boundary E1 by way of example, the original fin boundaries may be converted to the new fin boundaries according to Equation 3 below. In Equation 3 below, An may be a location difference between upper fin boundaries of the original fin structures OF and the new fin structures NF corresponding thereto, while Bn may be a location difference between lower fin boundaries of the original fin structures OF and the new fin structures NF corresponding thereto.

$$An = \frac{OD-ND}{2} + (n-1)\times\{(OD+OT)-(ND+NT)\}$$ [Equation 3]

$$Bn = \frac{OD-ND}{2} - (OT-NT) +$$
$$(n-1)\times\{(OD+OT)-(ND+NT)\}$$

According to Equation 3, the original fin boundaries defining the locations of the original fin structures OF may be converted to the new fin boundaries defining the locations of the new fin structures NF. In addition, as the original fin boundaries are converted to the new fin boundaries, dummy fin structures DF may be additionally arranged in a space generated around the center line CL. Locations of the dummy fin structures DF may also be defined by Equation 3 above.

According to some example embodiments, methods of changing the original fin structures OF to the new fin structures NF may be different from the methods described with reference to FIGS. 8 to 10. For example, an arbitrary region may be defined with in a selection area for which the layout is to be changed, and the new fin structures may be formed to have a constant interval and width in the defined region. In this case, the region defined in the selection area may have the same area as that occupied by a standard cell, but is not necessarily limited thereto.

Figure 11:
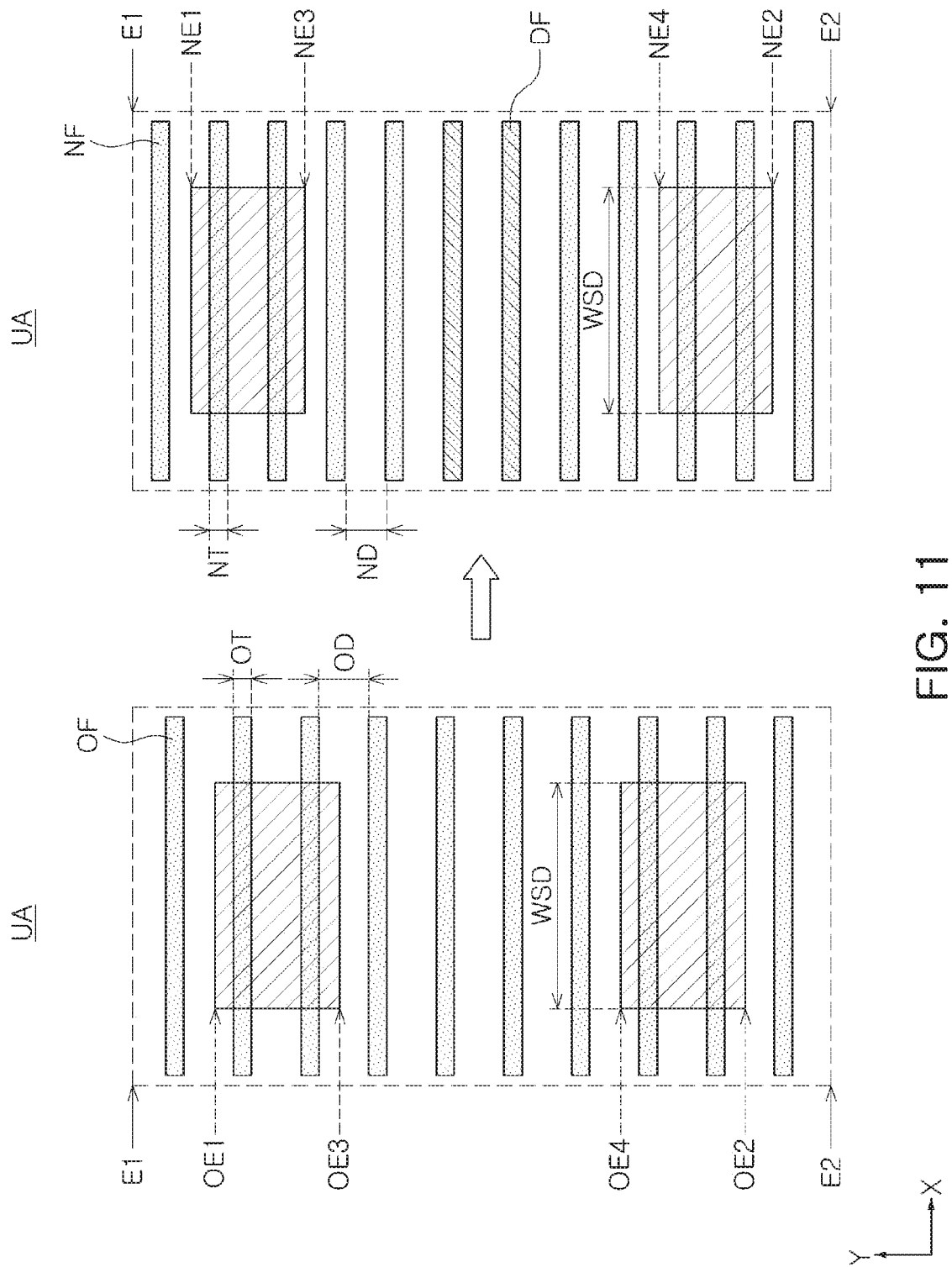
FIGS. 11 and 12 are diagrams illustrating a method of designing source/drain regions, in a method of designing a layout of a semiconductor device according to some example embodiments.
Figure 12:
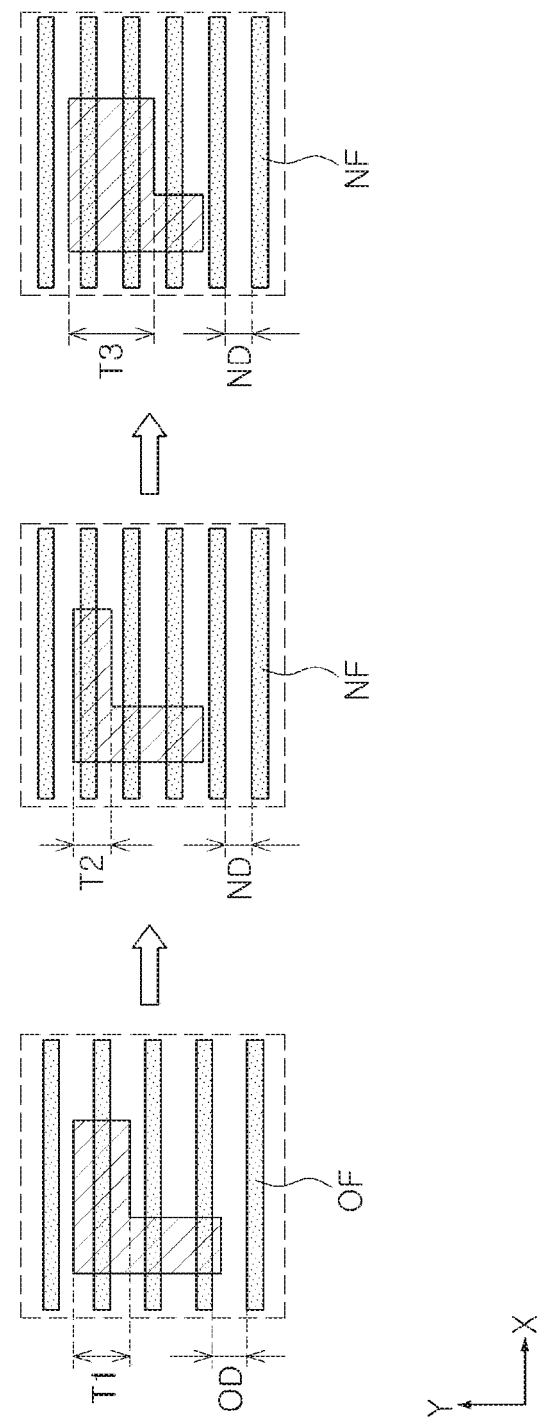

FIGS. 11 and 12 are diagrams illustrating a method of designing source/drain regions, in a method of designing a layout of a semiconductor device according to some example embodiments.

First, referring to FIG. 11, a selection area for which a layout of a semiconductor device is to be changed may be determined, and original fin structures OF included in the selection area may be converted in to new fin structures NF. In the example embodiment illustrated in FIG. 11, a width OT of the original fin structures OF and a width NT of the new fin structures NF may be the same as or different from each other. The new fin structures NF may be formed to have an interval ND less than an interval OD between the original fin structures OF.

Each of the original source/drain regions OSD may be connected to two original fin structures OF. To significantly reduce the change in electrical characteristics due to the layout change of the selection area, the number of fin structures connected to the source/drain regions may be maintained as it is. Thus, as illustrated in FIG. 11, each of new source/drain regions NSD may be connected to two new fin structures NF.

To maintain the number of original fin structures OF connected to the original source/drain regions OSD and the number of the new fin structures NF connected to the new source/drain regions NSD to be the same as each other, active boundaries NE1 to NE4 of the new source/drain regions NSD may be determined using active boundaries OE1 to OE4 of the original source/drain regions OSD. The active boundaries OE1 to OE4 and NE1 to NE4 may determine the locations of the source/drain regions OSD and NSD in the first direction (Y-axis direction). Regardless of the change in layout, a width WSD of the source/drain regions in the second direction (X-axis direction) may be maintained constantly, but in some example embodiments, the width WSD may also be changed in the new source/drain regions NSD.

The method of converting the active boundaries OE1 to OE4 of the original source/drain regions OSD to the active boundaries NE1 to NE4 of the new source/drain regions NSD is illustrated as in Equation 4 below.

$$NEn = OEn \pm n \times \{(OD+OT)-(ND+NT)\}$$ [Equation 4]

In Equation 4, n denotes the number of the original fin structures OF or the new fin structures NF arranged between the boundaries OE1 to OE4 and NE1 to NE4 and a first boundary E1 or a second boundary E2. For example, one original fin structure OF may be arranged between the first active boundary OE1 of the original source/drain regions OSD and the first boundary E1. The first active boundary OE1 of the original source/drain regions OSD may be converted in to the first active boundary NE1 of the new source/drain regions NSD by Equation 4 above.

Next, a case in which the number of fin structures connected to source/drain regions is changed in a selection area in which the layout is changed will be described with reference to FIG. 12. Referring to FIG. 12, the original source/drain region OSD may have an L shape, and a portion of the original source/drain region OSD extending in parallel with the original fin structures OF may have a first width T1.

When the layout is changed, the new fin structures NF having an interval ND less than an interval OD of the original fin structures OF may be formed in the selection area. The new source/drain region NSD may have an L shape similarly to the case of the original source/drain region OSD. To secure a process margin, a portion of the new source/drain region NSD, extending in parallel with the new fin structures NF, may have a second width T2 less than the first width T1.

However, a process for forming a new source/drain region NSD may be unachievable depending on a value of the second width T2. In this case, as illustrated in FIG. 12, the number of new fin structures NF connected to the new source/drain region NSD may be increased to solve a process problem. Therefore, a region of the new source/drain region NSD, extending in parallel with the new fin structures NF, may have a third width T3 greater than the first width T1. According to some example embodiments, a case in which the number of new fin structures NF connected to the new source/drain region NSD is less than the number of the original fin connected to the original source/drain region OSD may also occur, in contrast to the description with reference to FIG. 12.

Figure 13:
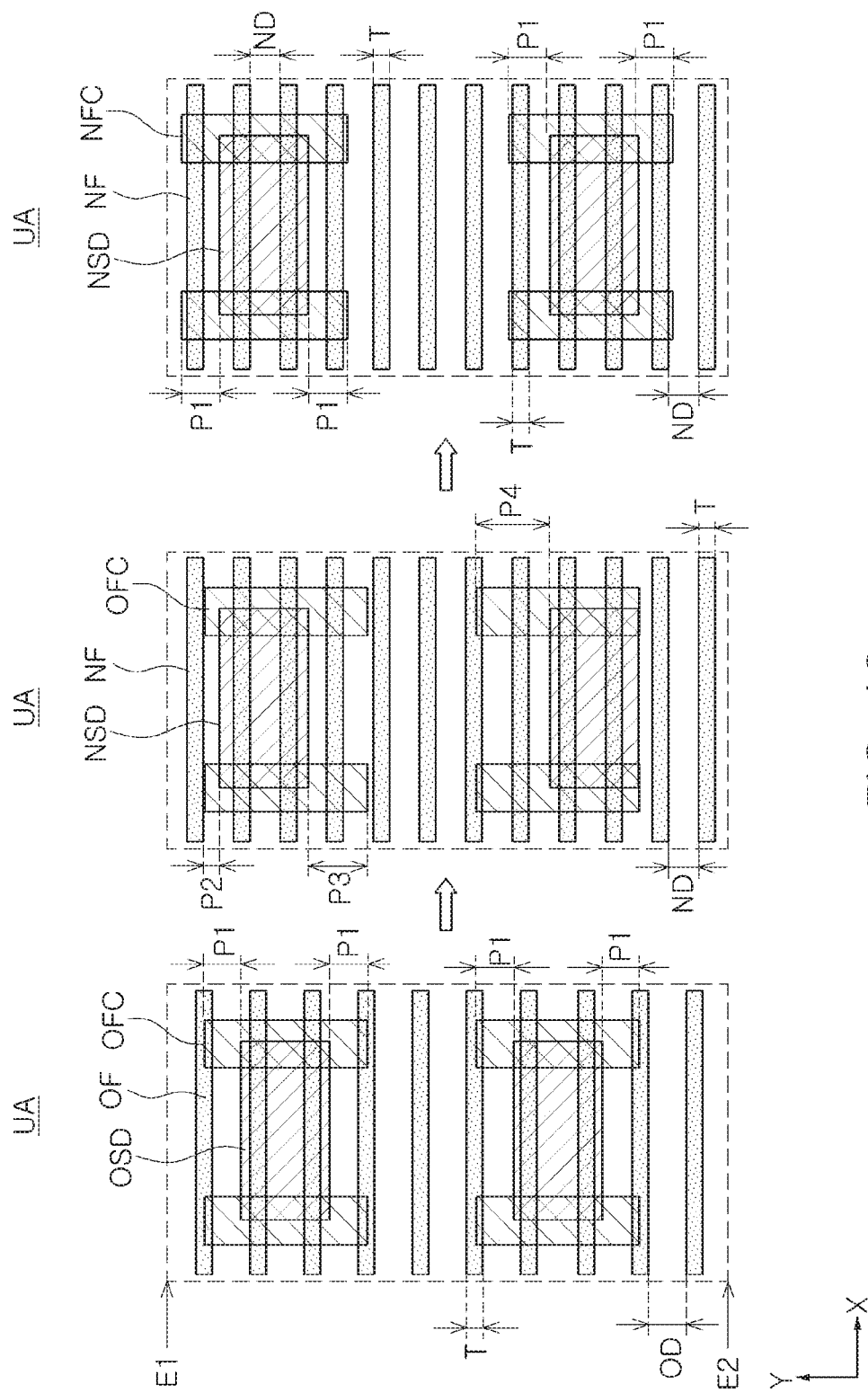
FIG. 13 provides views illustrating a method of designing cut areas, in a method of designing a layout of a semiconductor device according to some example embodiments.

FIG. 13 provides views illustrating a method of designing cut areas, in a method of designing a layout of a semiconductor device according to some example embodiments.

Referring to FIG. 13, cut areas OFC and NFC that divide the fin structures OF and NF may be provided in the semiconductor device. Referring to the unit area UA of the original layout illustrated in FIG. 13, original cut areas OFC may be defined based on the original source/drain regions OSD. For example, the boundary of each of the original cut areas OFC and the boundary of each of the original source/drain regions OSD may have a first interval P1. The first interval P1 may have a value defined by the design rule of the original layout.

The figure illustrated in the center of FIG. 13 may be a diagram illustrating a case in which new fin structures NF and new source/drain regions NSD are defined, and the original cut areas OFC are maintained as they are. In instances in which the original cut areas OFC are maintained as they are, as illustrated in FIG. 13, intervals between boundaries of the new source/drain regions NSD and the original cut areas OFC may be a second interval P2, a third interval P3, a fourth interval P4 and the like, different from each other. In addition, boundaries of some new source/drain regions NSD and the original cut area OFC may overlap, or a portion of the new fin structures NF may not be divided by the original cut area OFC.

Therefore, as illustrated in FIG. 13, the original cut areas OFC may be changed to the new cut areas NFC. In some example embodiments, the boundary of each of the new cut areas NFC may be separated from the boundary of each of the new source/drain regions NSD by the first interval P1.

FIGS. 14 to 18 are views illustrating a method of designing contacts, in a method of designing a layout of a semiconductor device according to some example embodiments.

Figure 14:
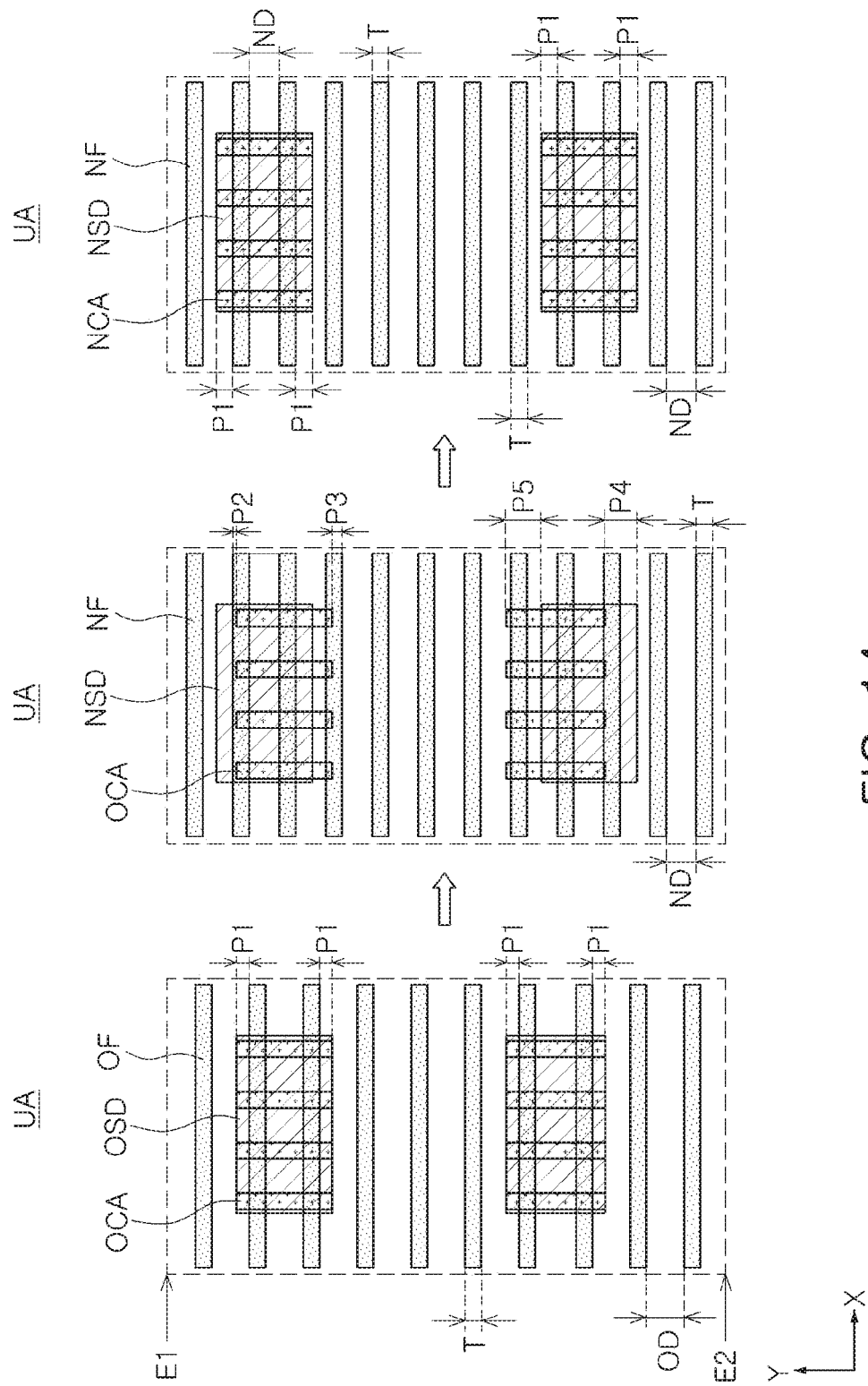
FIGS. 14 to 18 are views illustrating a method of designing contacts, in a method of designing a layout of a semiconductor device according to some example embodiments.

First, referring to FIG. 14, original fin structures OF and original source/drain regions OSD may be arranged in a unit area UA according to an original layout. Original active contacts OCA may be connected to the original source/drain regions OSD. For example, the original active contacts OCA may have a shape extending in a direction perpendicular to the first direction (Y-axis direction) and the second direction (X-axis direction) and penetrating through a portion of the original source/drain regions OSD.

The boundary of each of the original active contacts OCA may have a first interval P1 from the boundary of the original fin structures OF connected to the original source/drain regions OSD. The first interval P1 may be determined by the design rule of the original layout.

The figure illustrated in the center of FIG. 14 may be a diagram illustrating a case in which new fin structures NF and new source/drain regions NSD are defined, and original active contacts OCA are maintained as they are. If the location of the original active contacts OCA is maintained as it is, alignment errors may occur between the original active contacts OCA and the new source/drain regions NSD as illustrated in FIG. 14. Further, an interval between the boundary of each of the original active contacts OCA and the boundary of the new fin structures NF connected to the new source/drain regions NSD may be changed to second to fifth intervals P2 to P5, not the first interval P1.

Thus, as illustrated in FIG. 14, the original active contacts OCA may be changed to new active contacts NCA. In some example embodiments, the boundary of each of the new active contacts NCA may be separated from the boundary of each of the new source/drain regions NSD by the first interval P1.

Figure 15:
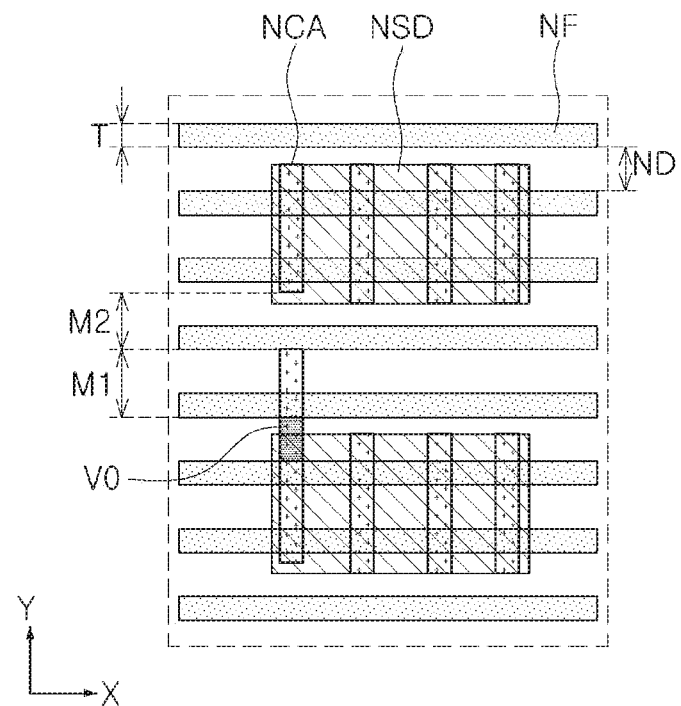
Figure 16:
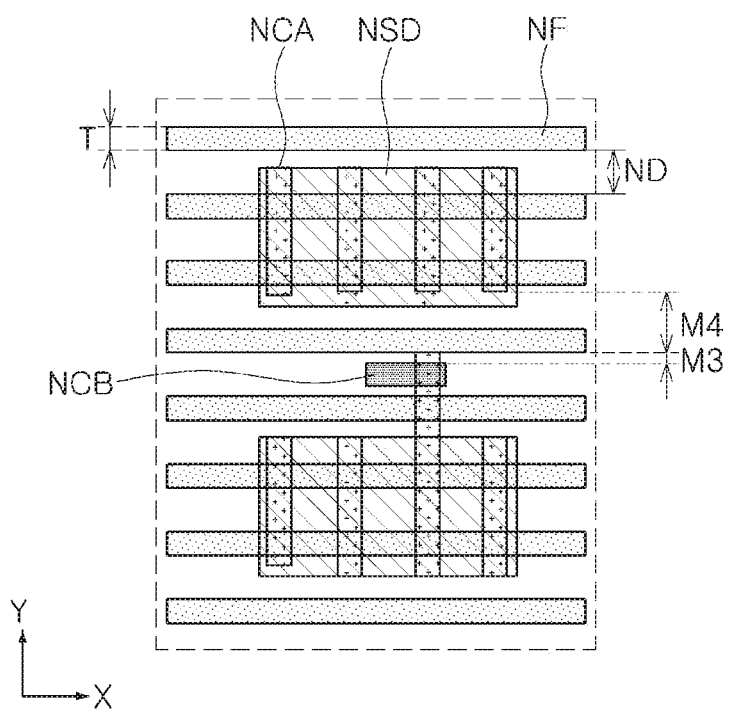

FIGS. 15 and 16 are diagrams illustrating design features to be considered in addition to the location of new source/drain regions NSD when determining the location of new active contacts NCA. In the example embodiments illustrated in FIGS. 15 and 16, locations of new fin structures NF, the new source/drain regions NSD, and the new active contacts NCA may be changed in a selection area of a semiconductor device for which the layout is to be changed.

First, referring to FIG. 15, a via V0 may be connected to at least one of the new active contacts NCA. In this case, a boundary of the via V0 may have a first process margin M1 with a boundary of the new active contact NCA connected to the via V0. The first process margin M1 may be determined by a design rule or the like.

A process margin between new active contacts NCA adjacent to each other in the first direction (Y-axis direction) may be indicated by a design rule. Referring to FIG. 15, a second process margin M2 may be secured between new active contacts NCA connected to different new source/drain regions NSD which are adjacent to each other in the first direction. Since the location and size of the new active contact NCA connected to the via V0 is determined by the first process margin M1, a portion of the new active contacts NCA may be formed to be relatively short in the first direction, to secure the second process margin M2.

Next, referring to FIG. 16, at least one of the new active contacts NCA may be connected to a new gate contact NBC. A boundary of the new gate contact NBC may have a third process margin M3 with a boundary of the new active contact NCA connected to the new gate contact NBB. The third process margin M3 may be determined by a design rule or the like.

Similar to the example embodiment illustrated in FIG. 15, a process margin between new active contacts NCA adjacent to each other in the first direction (Y-axis direction) may be indicated by a design rule. On the other hand, in the example embodiment illustrated in FIG. 16, the third process margin M3 may need to be secured on the new active contact NCA connected to the new gate contact NBB in the example embodiment illustrated in FIG. 16. Therefore, the new active contact NCA connected to the new gate contact NBC and the other new active contacts NCA adjacent to each other in the first direction may have a relatively short length.

Figure 17:
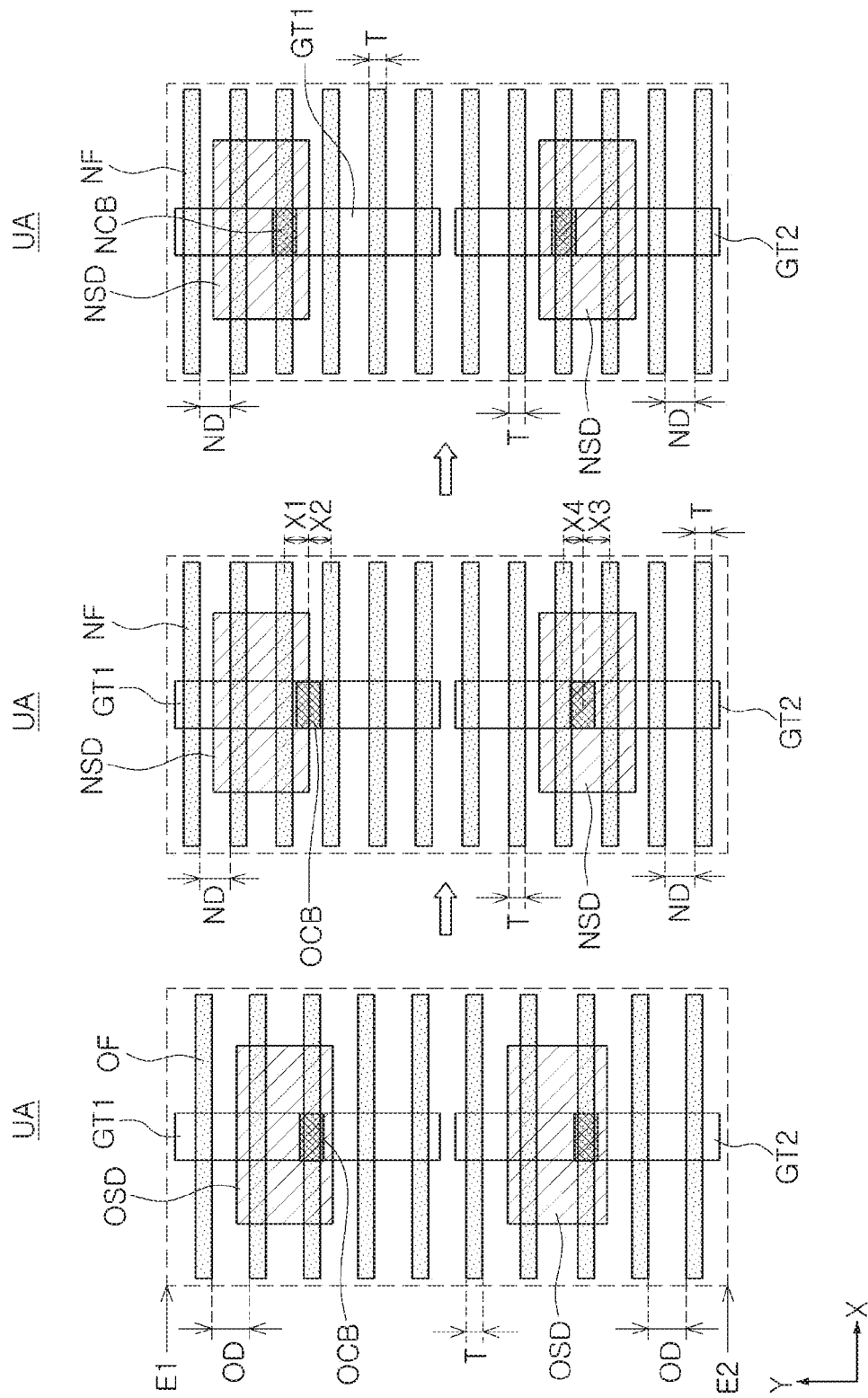
Figure 18:
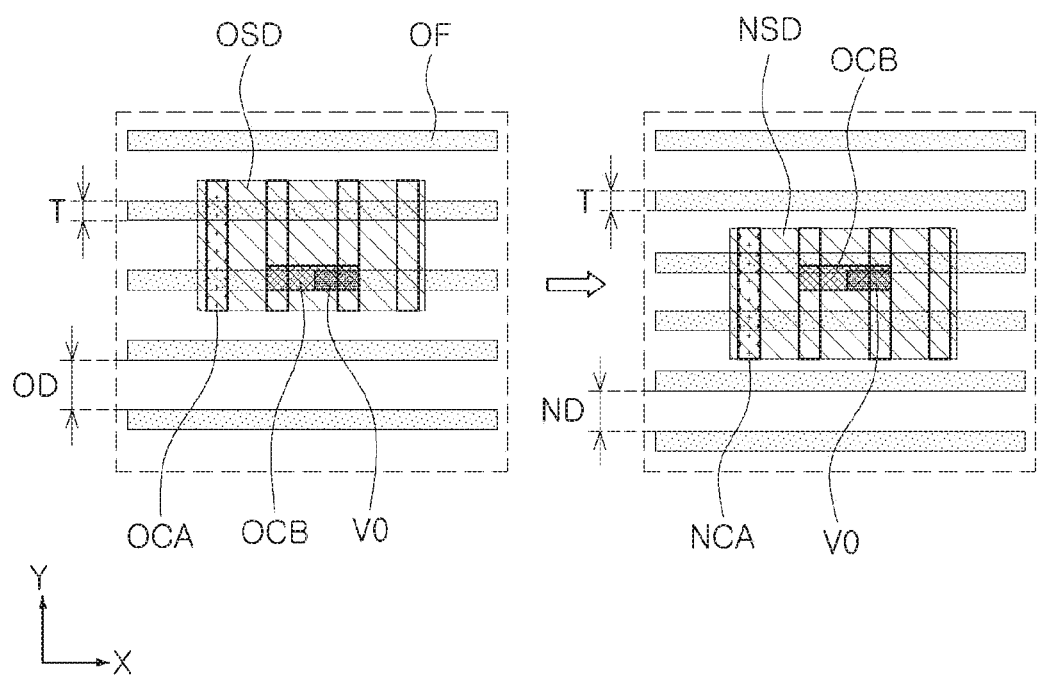

FIGS. 17 and 18 are views illustrating a method of changing a location of a gate contact depending on a layout change. For example, in the layout design method according to some example embodiments, the location of a gate electrode GT may not be changed, while the location of a gate contact connected to the gate electrode GT may be changed.

First, referring to FIG. 17, the unit area UA of the original layout may include original fin structures OF, original source/drain regions OSD, and gate electrodes GT1 and GT2. Each of the gate electrodes GT1 and GT2 may be connected to an original gate contact OCB, and in an example embodiment, the original gate contact OCB may be disposed on an upper portion of one of the original fin structures OF.

When the layout is changed, the original fin structures OF and the original source/drain regions OSD may be replaced with new fin structures NF and new source/drain regions NSD, respectively. Therefore, if the original gate contact OCB is maintained as it is, the original gate contact OCB may not be arranged on one of the new fin structures NF. Referring to FIG. 17, the original gate contact OCB may be disposed between the new fin structures NF in the first direction (Y-axis direction) depending on a layout change.

In some example embodiments of the present inventive concept, the location of the new gate contact NCB may be determined in consideration of a distance between a center line of the original gate contact OCB and a center line of each of the new fin structures NF adjacent to the original gate contact OCB. Referring to FIG. 17, in the first gate electrode GT1, the original gate contact OCB may have a first distance X1 and a second distance X2 from the new fin structures NF vertically adjacent thereto, respectively. In the example embodiment illustrated in FIG. 17, the first distance X1 may be less than the second distance X2. Therefore, the location of the new gate contact NCB connected to the first gate electrode GT1 may be determined as an upper portion of a third new fin structure NF from a first boundary E1 of the unit area UA.

In addition, referring to FIG. 17, in the second gate electrode GT2, the original gate contact OCB may have a third distance X3 and a fourth distance X4 from the new fin structures NF vertically adjacent thereto, respectively. In an example embodiment illustrated in FIG. 17, the fourth distance X4 may be less than the third distance X3. Therefore, the location of the new gate contact NCB connected to the second gate electrode GT2 may be determined as an upper portion of a fourth new fin structure NF from a second boundary E2 of the unit area UA.

Referring next to FIG. 18, depending on a layout change, the original fin structures OF and the original source/drain regions OSD may be replaced with new fin structures NF and new source/drain regions NSD, respectively. Referring to the original layout in the example embodiment illustrated in FIG. 18, a via V0 may be connected to the original gate contact OCB.

Therefore, when the location of the original gate contact OCB is changed depending on the layout change, the location of the via V0 may need to be changed together. When the location of the via V0 is changed, since the location of a metal wire connected to an upper portion of the via V0 should be changed together, the location of the original gate contact OCB may be maintained as it is in the case in which the via V0 is connected to the original gate contact OCB as illustrated in FIG. 18. In the layout design method according to some example embodiments of the present inventive concepts, the locations of the fin structures, the active region, and the contact may be relocated, while the arrangement of the metal line is maintained as possible.

On the other hand, in a case in which the via V0 is only connected to the original active contact OCA, not the original gate contact OCB, the location of the original gate contact OCB may be changed. The method of changing the location of the original gate contact OCB may be as described above with reference to FIG. 17.

Figure 19:
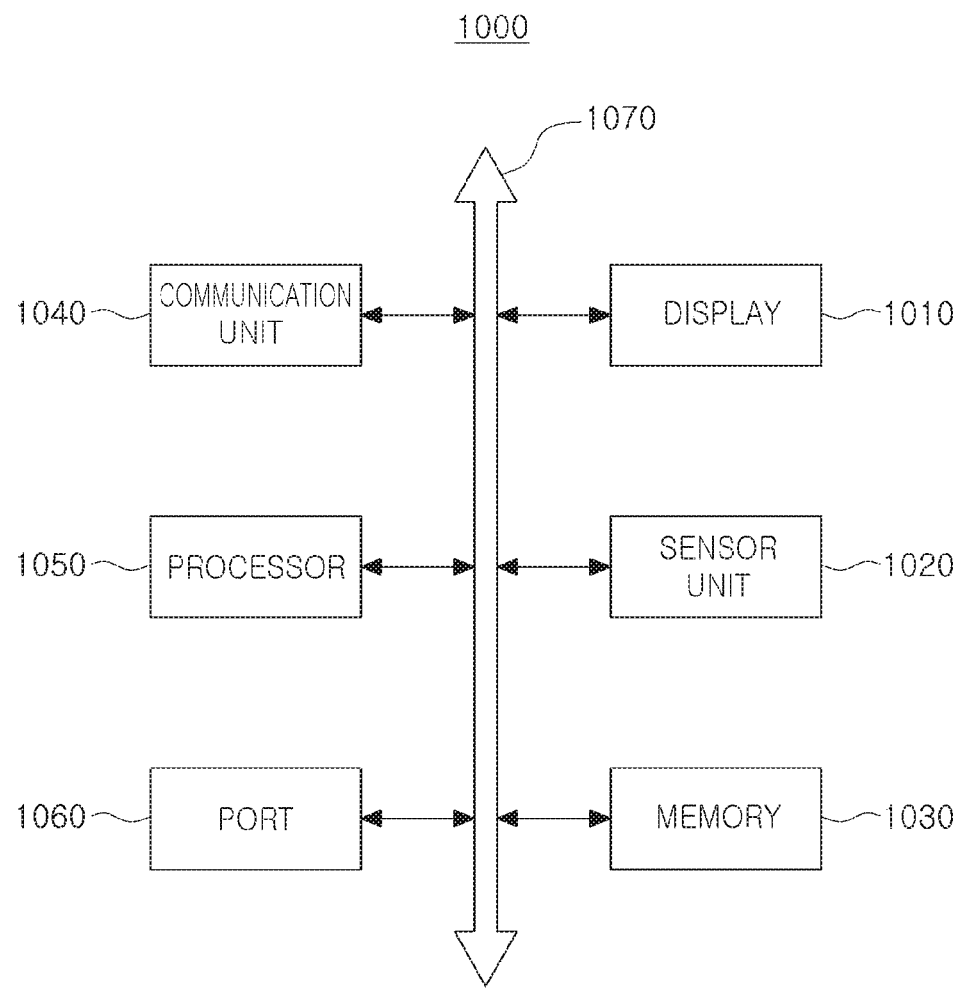
FIG. 19 is a schematic block diagram of an electronic device including a semiconductor device produced by a method according to some example embodiments.

FIG. 19 is a block diagram schematically illustrating an electronic device that includes a semiconductor device produced by a method according to some example embodiments.

As illustrated in FIG. 19, in some example embodiments an electronic device 100 includes a display 1010, a sensor unit 1020, a memory 1030, a communication unit 1040, a processor 1050, a port 1060, and the like. The electronic device 1000 may further include a power supply device, an input/output device and the like. Among the components illustrated in FIG. 19, the port 1060 may be a device provided for the electronic device 1000 to communicate with a video card, a sound card, a memory card, a USB device, and the like. The electronic device 1000 may conceptually encompass a general desktop computer, a laptop computer, a smartphone, a tablet PC, a smart wearable device, or the like.

The processor 1050 may be configured to perform one or more specific operations, instructions, tasks, and the like. The processor 1050 may be a central processing unit (CPU) or a microprocessor unit (MCU), a system on chip (SoC), or the like, and may communicate with other devices connected to the port 1060 as well as with the display 1010, the sensor unit 1020, the memory 1030 and the communication unit 1040, via a bus 1070. The sensor unit 1020 may include various sensors that collect ambient information, and for example, may include an acoustic sensor, an image sensor, a global positioning system (GPS) sensor, or the like.

The memory 1030 may be a storage medium that stores data required for the operation of the electronic device 1000, multimedia data, or the like. The memory 1030 may include a volatile memory, such as a random access memory (RAM) or the like, and/or a nonvolatile memory, such as a flash memory or the like. The memory 1030 may also include at least one of a solid state drive (SSD), a hard disk drive (HDD), and an optical drive (ODD), as a storage device, although the present disclosure is not limited thereto.

According to the example embodiment illustrated in FIG. 19, in the electronic device 1000 the display 1010, the sensor unit 1020, the memory 1030, the communication unit 1040, the processor 1050, and the like may include various semiconductor devices. The semiconductor devices may be manufactured/produced by the layout design method described above with reference to FIGS. 1 to 18. For example, when a new process is developed to improve the performance of semiconductor devices and reduce power consumption thereof, the original layout suitable for the existing process may be quickly changed to a new layout suitable for a new process and may be verified, thereby enabling the application of the new process to a production process of semiconductor devices. As such, productivity may be increased, the performance of semiconductor devices may be improved, and the semiconductor devices may have reduced power consumption.

As set forth above, according to some example embodiments, at least a portion of a designed original layout may be determined as a selection area for which the at least a portion of the designed original layout is to be changed to a new layout, and the position of a source/drain region and an interval between fin structures included in the selection area, or the like may be changed. Therefore, when a new process that may improve power consumption, performance, and/or provide other advantages is developed in a situation in which the layout design is completed, the selection area to which the new process may be applied may be easily changed from the original layout to the new layout. As a result, by significantly reducing the time and resources required for design changes, a new process may be quickly applied to actual product production, and power consumption of semiconductor devices may be reduced and performance of semiconductor devices may be improved.

While some example embodiments have been shown and described above, it will be apparent to those skilled in the art that modifications and variations could be made without departing from the scope of the present inventive concepts as defined by the appended claims.

What is claimed is:

1. A method of designing a layout of a semiconductor device, comprising:
   determining, from among a plurality of integrated circuit (IC) blocks included in the semiconductor device, a selection IC block for which a layout is to be changed;
   changing a spacing interval at which fin structures included in the selection IC block are spaced apart from each other in a first direction from a first spacing interval to a second spacing interval; and
   adjusting locations in the selection IC block of source/drain regions connected to the fin structures spaced apart from each other in the first direction at the second spacing interval, wherein the adjusting is based on the changing of the spacing interval from the first spacing interval to the second spacing interval.

2. The method of claim 1, further comprising:
determining in the selection IC block a location of a cut area dividing the fin structures; and
determining in the selection IC block a location of a contact connected to at least one of the source/drain regions and a gate electrode.

3. The method of claim 1, further comprising:
merging the selection IC block with a non-selection IC block that is different from the selection IC block to generate a new layout for the semiconductor device; and
verifying the new layout.

4. The method of claim 3, wherein the verifying of the new layout comprises performing a design rule check (DRC) on the new layout and performing a layer-versus-layer (LVL) comparison on the new layout.

5. The method of claim 3, wherein fin structures included in the non-selection IC block are spaced apart from each other in the first direction at the first spacing interval.

6. The method of claim 1, wherein the spacing interval of the fin structures included in the selection IC block is changed by using as a reference at least one power line in the selection IC block that extends in a second direction that intersects the first direction, or a center line defined between a pair of power lines adjacent to each other in the first direction.

7. The method of claim 1, wherein at least one unit area is defined in the selection IC block, and wherein the fin structures included in the selection IC block are arranged at the second spacing interval in the unit area.

8. The method of claim 1, wherein locations of each of the fin structures included in the selection IC block are changed in the first direction, and wherein dummy fin structures are added between at least two of the fin structures.

9. The method of claim 8, wherein the location of each of the fin structures included in the selection IC block is changed by using, as a reference, at least one power line in the selection IC block that extends in a second direction that intersects the first direction, in the selection IC block, or a center line defined between a pair of power lines adjacent to each other in the first direction.

10. The method of claim 1, wherein each of the source/drain regions comprises a first boundary and a second boundary that are both parallel to a second direction that intersects the first direction, and wherein the location of each of the source/drain regions is adjusted by moving the first boundary and the second boundary of the source/drain region in the first direction.

11. The method of claim 10, wherein a moving displacement of the first boundary and a moving displacement of the second boundary of at least some of the source/drain regions are different from each other.

12. The method of claim 10, wherein a location of a cut area that divides the fin structures is determined based on the first boundary and the second boundary of each of the source/drain regions as references.

13. The method of claim 1, further comprising determining locations of active contacts connected to the source/drain regions, wherein the locations of the active contacts are determined based on the locations of the fin structures having the second spacing interval in the first direction.

14. The method of claim 13, wherein the locations of the active contacts are determined such that an interval between the active contacts adjacent to each other in the first direction is equal to or greater than a predetermined reference interval.

15. The method of claim 13, wherein at least one of the active contacts is connected to a via, and wherein the locations of the active contacts are determined in such a manner that an interval between the via and a boundary of the active contact connected to the via is equal to or greater than a predetermined reference interval.

16. A method of designing a layout of a semiconductor device, comprising:
determining in the semiconductor device a selection area in which an original layout is to be changed to a new layout, and a non-selection area in which the original layout is to be maintained;
changing the original layout of the selection area to the new layout such that a second spacing interval between fin structures in the selection area is less than a first spacing interval between fin structures in the non-selection area, wherein the fin structures are spaced apart from each other in a first direction parallel to an upper surface of a substrate;
generating an entire layout for the semiconductor device by merging the selection area and the non-selection area; and
verifying the entire layout.

17. The method of claim 16, wherein the selection area and the non-selection area comprise IC blocks performing different functions.

18. The method of claim 16, wherein an interval between gate electrodes included in the selection area and an interval between gate electrodes included in the non-selection area equal each other.

19. The method of claim 16, wherein the selection area designed by the original layout and the selection area designed by the new layout comprise IC blocks that perform the same function.

20. A method of designing a layout of a semiconductor device, comprising:
replacing original fin structures spaced apart from each other in a first direction by a first spacing interval with new fin structures spaced apart from each other in the first direction by a second spacing interval, less than the first spacing interval;
arranging new source/drain regions with respect to a boundary of the new fin structures that is parallel to a second direction that intersects the first direction;
arranging a cut area that divides the new fin structures with respect to a boundary of the new source/drain regions that is parallel to the second direction; and
arranging new active contacts connected to the new source/drain regions with respect to the boundary of the new fin structures that is parallel to the second direction.

* * * * *